(12) United States Patent
Guo et al.

(10) Patent No.: US 9,252,234 B2
(45) Date of Patent: *Feb. 2, 2016

(54) PARTIALLY-BLOCKED WELL IMPLANT TO IMPROVE DIODE IDEALITY WITH SIGE ANODE

(75) Inventors: Dechao Guo, Fishkill, NY (US); Wilfried E. Haensch, Somers, NY (US); Gan Wang, Fishkill, NY (US); Yanfeng Wang, Fishkill, NY (US); Xin Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

This patent is subject to a terminal disclaimer.

(21) Appl. No.: 13/605,290

(22) Filed: Sep. 6, 2012

(65) Prior Publication Data

US 2014/0065807 A1 Mar. 6, 2014

(51) Int. Cl.
| | |
|---|---|
| *H01L 21/8238* | (2006.01) |
| *H01L 29/66* | (2006.01) |
| *H01L 29/739* | (2006.01) |
| *H01L 29/165* | (2006.01) |
| *H01L 21/425* | (2006.01) |
| *H01L 29/16* | (2006.01) |

(52) U.S. Cl.
CPC ........ *H01L 29/66356* (2013.01); *H01L 29/165* (2013.01); *H01L 29/7391* (2013.01); *H01L 29/1608* (2013.01)

(58) Field of Classification Search
USPC .......... 438/223, 224, 227, 228, 510, 527, 531
See application file for complete search history.

(56) References Cited

U.S. PATENT DOCUMENTS

| | | | |
|---|---|---|---|
| 5,455,429 A * | 10/1995 | Paoli et al. ................ 257/20 |
| 6,172,401 B1 | 1/2001 | Brand | |
| 6,396,107 B1 | 5/2002 | Brennan et al. | |
| 7,132,712 B2 | 11/2006 | Kocon et al. | |
| 7,186,596 B2 | 3/2007 | Min et al. | |
| 7,227,204 B2 | 6/2007 | Maciejewski et al. | |
| 7,732,835 B2 | 6/2010 | Voegeli et al. | |
| 7,943,471 B1 | 5/2011 | Buller et al. | |
| 2006/0076613 A1 * | 4/2006 | Ohyanagi et al. ............. 257/330 |
| 2010/0032670 A1 * | 2/2010 | Aggarwal et al. ............... 257/48 |
| 2010/0084729 A1 * | 4/2010 | Steinbrueck et al. ......... 257/434 |
| 2012/0007207 A1 | 1/2012 | Salcedo | |
| 2013/0229223 A1 * | 9/2013 | Shrivastava et al. .......... 327/438 |

OTHER PUBLICATIONS

V. K. Wong, et al., "Mutiple Techniques Approach Failure Analysis for a Blocked p+ Implant Induced Leakage in a ESD Protection Diode," Proceedings of the 9th International Symposium on the Physical and Failure Analysis of Integrated Circuits, IPFA, 2002, pp. 183-186.
P. Li, et al., "Site Anode Lateral Isolated-Gate Heterojunction Bipolar Transistor," Proceedings, 6th International Conference on Solid-State and Integrated-Circuit Technology, 2001, vol. 1, pp. 612-615.

* cited by examiner

*Primary Examiner* — Calvin Choi
(74) *Attorney, Agent, or Firm* — Cantor Colburn LLP; Vazken Alexanian

(57) ABSTRACT

A method of manufacturing a semiconductor device is disclosed. A p-type substrate is doped to form an N-well in a selected portion of a p-type substrate adjacent an anode region of the substrate. A p-type doped region is formed in the anode region of the p-type substrate. The p-type doped region and the N-well form a p-n junction.

17 Claims, 5 Drawing Sheets

U.S. 9,252,234 B2

PARTIALLY-BLOCKED WELL IMPLANT TO IMPROVE DIODE IDEALITY WITH SIGE ANODE

BACKGROUND

The present invention relates generally to semiconductor manufacturing and, in particular, to a method of manufacturing a diode that has an improved ideality.

Semiconductor diodes are commonly formed on a substrate that has a region doped with n-type dopants, e.g. phosphorous, arsenic, and a region doped with p-type dopants, eg. boron. The relation between voltage and current for an ideal diode is known. Various parameters may affect the ideality of the diode or the approximation of the diode to an ideal diode. The parameters may include, for example, a depth of a p-n junction between the p-type doped region and the n-type doped region, material quality and manufacturing procedures. Factors such as material quality and manufacturing procedures can affect the voltage-current relation to be different than that of an ideal diode.

SUMMARY

According to one embodiment, a method of manufacturing a semiconductor device includes: doping a p-type substrate to form an N-well in a selected portion of a p-type substrate adjacent an anode region of the substrate; and forming a p-type doped region in the anode region of the p-type substrate to manufacture the semiconductor device, wherein the p-type doped region and the N-well form a p-n junction.

According to another embodiment, a method of manufacturing a diode includes: placing a photoresist layer over a p-type substrate to cover a portion of the p-type substrate and leave exposed another portion of the p-type substrate; forming an N-well at the exposed portion of the p-type substrate, wherein the covered portion forms an anode region; and forming a p-type doped region in the anode to form a p-n junction between the p-type doped region and the N-well.

According to another embodiment, a method of manufacturing a diode includes: forming an anode and an N-well on a substrate by partial blocking the substrate during ion doping; and forming an extrinsically p-type doped region in the anode region to form a p-n junction of the diode between the extrinsically p-type doped region and the N-well.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
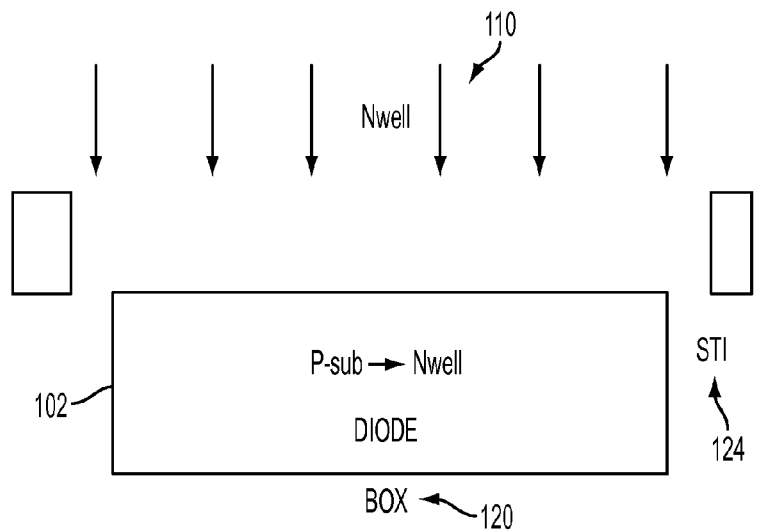
FIG. 1 illustrates an ion implantation stage of an N-well semiconductor diode.
Figure 2:
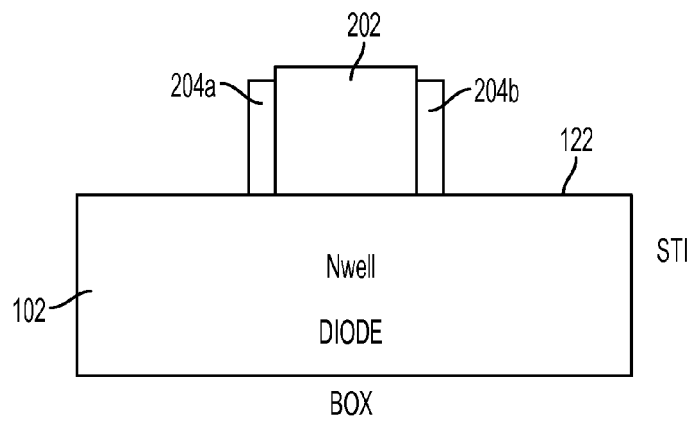
FIG. 2 illustrates an intermediate construction stage of an N-well semiconductor diode.
Figure 3:
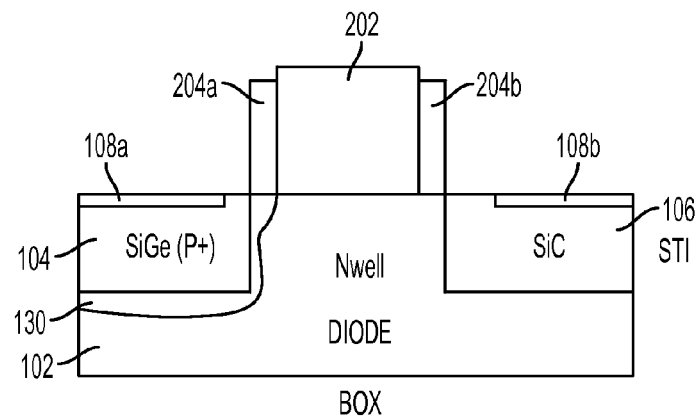
FIG. 3 illustrates an extrinsic doping stage for forming an N-well semiconductor diode.

FIGS. 1-3 show a process for forming a semiconductor on an N-well substrate. In FIG. 1, a substrate 102 is provided. In various embodiments, the substrate is a p-type substrate and may be a component of an integrated chip. The substrate 102 may be disposed on an insulating layer such as a buried oxide layer (BOX) 120. The substrate 102 may also include a shallow trench isolation 124 formed therein that, along with the buried oxide layer 120, prevents a cross-talk between electrical activity of the diode formed from substrate 102 and other components of the integrated chip. The p-type substrate 102 is doped with negatively-charged ions 110 to form an N-well. A photoresist layer 108 leaves the p-type substrate fully exposed to the negatively-charged ions. The N-well may be formed by ion implantation, ion diffusion or other suitable method. In various embodiments, the N-well extends throughout the p-type substrate. Thus, the p-type substrate may be referred to as an N-well 102 with reference to FIGS. 2 and 3.

FIG. 2 illustrates an intermediate fabrication stage of the semiconductor diode. Various elements may be deposited on the surface for use in electronic systems. Exemplary gate stack 202 is formed on the surface 122 of the substrate 102. The gate stack 202 may include spacers 204a and 204b formed on sidewalls thereof. In the exemplary embodiment, the gate stack 202 and spacers 204a and 204b are formed on the surface of the N-well 102.

FIG. 3 illustrates an extrinsic doping stage for forming a semiconductor on the N-well configuration of FIG. 2. Extrinsic doping is performed in the N-well 102 to form a p-type doped region 104 and a n-type doped region 106. The p-type doped region 104 and the n-type doped region 106 are formed in the N-well 102 and extends from the surface 122 a selected depth of the substrate. In one embodiment, the p-type doped region 104 is a region of silicon germanium (SiGe) that is epitaxially grown with in-situ doped p-type dopants, e.g. boron, and the n-type doped region 304 is formed of epitaxial silicon carbon (SiC) with in-situ doped n-type dopants, e.g. phosphorous. The p-type doped region 104 and the n-type doped region 106 may reside at opposite sides of the gate formation 202. Electrode 108a is applied to the surface of the p-type doped region 104 and electrode 108b is applied to the surface of the n-type doped region 106. Wires (not shown) may then be coupled to the electrodes 108a and 108b to provide a circuit path that provides a carrier flow through the diode.

In the exemplary diode formed via the stages shown in FIGS. 1-3, a p-n junction 130 is formed at the interface of the p-type doped region 104 and the N-well 102. P-N junctions are active sites where the electronic action of a semiconductor device takes place. The size of the p-n junction is related to the interface and between the p-type doped region 104 and the N-well 102 as well as the dopant concentrations. In the diode formed using the method shown in FIGS. 1-3, a carrier lifetime in the p-n junction is reduced due to several factors, including a low SiGe bandgap, a high dopant concentration across the p-n junction, and a high density of defects on the SiGe/N-well interface either in the p-n junction 130 or close to the p-n junction 130, among others. Grain boundaries may scatter the electrons and holes, thereby limiting the ideality of the diode.

Figure 4:
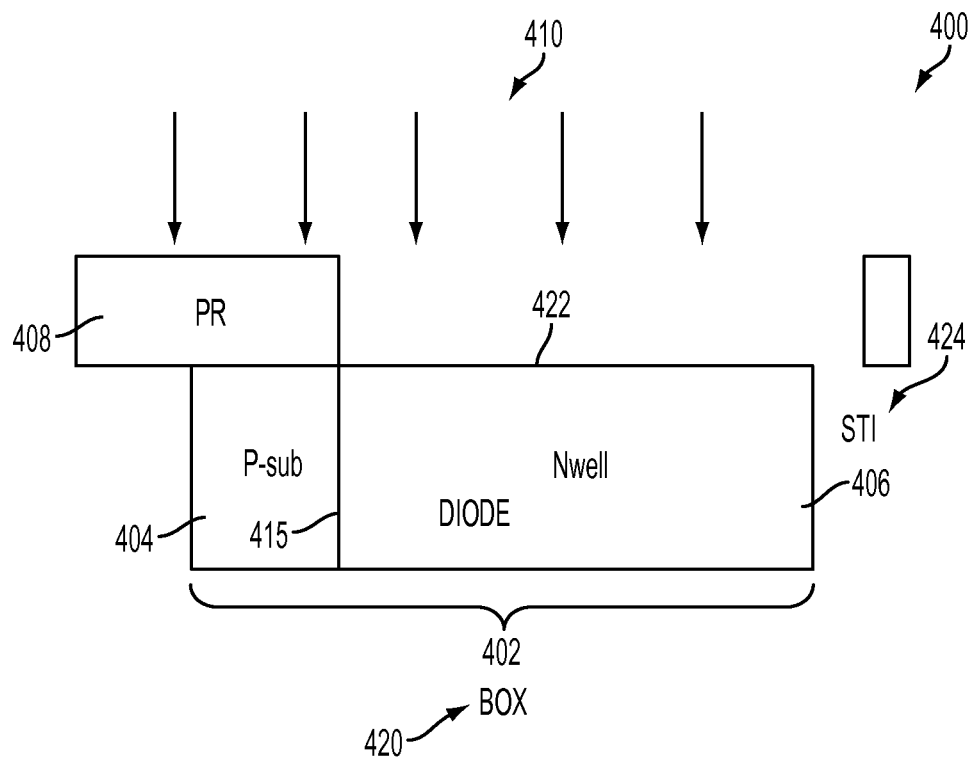
FIG. 4 illustrates an ion implantation stage during which an anode and N-well are formed in a substrate in an exemplary embodiment.
Figure 5:
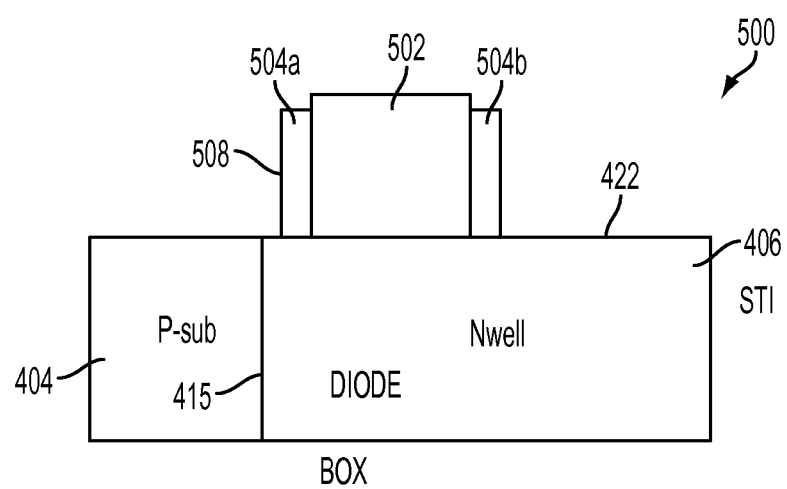
FIG. 5 illustrates an intermediate construction stage of a semiconductor diode using the substrate formed in the ion implantation stage.
Figure 6:
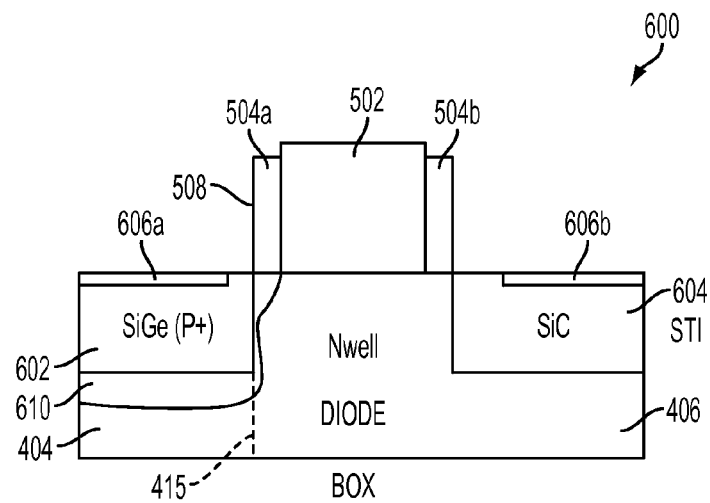
FIG. 6 illustrates an extrinsic doping stage for the exemplary semiconductor.

FIGS. 4-6 illustrate a process for fabricating a semiconductor diode according to an exemplary method disclosed herein. In the exemplary method, the semiconductor diode is fabricated using a substrate formed by partial substrate blocking during an ion implantation stage. FIG. 4 illustrates an ion implantation stage 400 during which an anode 404 and N-well 406 are formed in a substrate 402. In an exemplary embodiment, the substrate 402 may be a component of an integrated chip. The substrate 402 may be disposed on an insulating layer such as a buried oxide layer (BOX) 420. The substrate 402 may also include a shallow trench isolation 424 formed therein that, along with the buried oxide layer 420, prevents a cross-talk between electrical activity of the diode formed from substrate 402 and other components of the integrated chip. The substrate 402 may be a p-type substrate created by adding a given amount of p-type ions to the substrate. N-well 406 is formed in the substrate by implanting n-type ions 410. A photoresist layer 408 is deposited and patterned over a first portion of the substrate 402, while leaving a second portion exposed. N-type ions 410 are implanted in the exposed portion of the substrate using ion implantation, ion diffusion or other suitable method. The unexposed portion of the substrate 402 is protected from n-type ions 410 by the photoresist layer 408 and therefore does not receive n-type ions 410 at the ion implantation stage 400. Thus, the unexposed portion of the substrate 402 remains doped with p-type ions and forms an anode 404 of the substrate 402. An interface 415 may be formed between the N-well 406 and the anode 404 at a location defined by the exposing edge of the photoresist 408. In various embodiments, the interface 415 extends from a top surface 422 of the substrate 402 to a surface adjacent the buried oxide layer 420 or similar surface opposite the top surface 422. In various embodiments, the anode 404 and N-well 406 may be used to create a semiconductor device such as a diode, as shown in FIGS. 5 and 6. While the disclosure is described with respect to forming an N-well on a p-type substrate, the methods disclosed herein may equally be used to form a P-well on an n-type substrate.

FIG. 5 illustrates an intermediate fabrication stage 500 of the semiconductor diode. Various elements may be deposited on the surface for use in electronic systems. Exemplary gate stack 502 is formed on the surface 422 of the substrate. The gate stack 502 may include spacers 504a and 504b formed on sidewalls thereof. In the exemplary embodiment, the gate stack 502 and spacers 504a and 504b are formed on the surface of the N-well 406. An outer sidewall 508a of spacer 504a may be substantially along the interface 415 or proximate the interface 415.

FIG. 6 illustrates an extrinsic doping stage 600 for the exemplary semiconductor. Extrinsic doping is performed in both the N-well 406 and anode 404. During the extrinsic doping stage, a p-type doped region 602 is formed in the anode 404 and a n-type doped region 604 is formed in the N-well. In one embodiment, the p-type doped region 602 includes silicon germanium (SiGe) with in-situ doped boron and the n-type doped region 604 includes silicon carbon (SiC) with in-situ doped phosphorus. In alternate embodiments, other p-type dopants and n-type dopants may be used in the p-type doped region 602 and the n-type doped region 604, respectively. The p-type doped region 602 may be formed by depositing a SiN hard mask followed by a photoresist layer over the substrate to expose a portion of the substrate on one side (i.e., the left hand side) of the gate stack 502. The exposed portion is then etched to form a cavity. After the removal of the photoresist layer, SiGe is then deposited in the etched cavity via epitaxial growth to form the p-type doped region 602. Another SiN hard mask is deposited followed by another photoresist layer deposition to expose a portion of the substrate on another side (i.e., the right hand side) of the gate stack 502. The exposed portion is then etched to form a cavity. After the removal of the photoresist layer, SiC is then deposited in the cavity via epitaxial growth to form the n-type doped region 604. It will be appreciated, however, that in an alternative embodiment the SiC growth may be performed prior to the SiGe growth.

A boundary of the p-type doped region 602 is substantially along the interface 415 between the anode 404 and the N-well 406. In general, the p-type doped region 602 extends from the surface 422 to a selected depth in the substrate. An n-type doped region 604 is formed in the N-well 406 that extends from the surface 422 a selected depth of the substrate. In one embodiment, the p-type doped region 602 and the n-type doped region 604 may reside at opposite sides of the gate stack 502. Electrode 606a is applied to the surface of the p-type doped region 602 and electrode 606b is applied to the surface of the n-type doped region 604. Wires (not shown) may then be coupled to the electrodes 606a and 606b to provide a circuit path that provides a carrier flow through the diode.

In the exemplary diode resulting via the fabrication stages shown in FIGS. 4-6, a p-n junction 610 is formed around the p-type doped region 602. The present disclosure therefore creates a p-type and n-type material that is devoid of grain boundaries. The p-n junction 610 may extend into the N-well as well as into the anode 404 below the p-type doped region 602. Therefore, a section of the p-n junction 610 in the anode region has a greater volume than the corresponding section of the p-n junction formed using the fabrication methods of FIGS. 1-3. With respect to prior art diodes, there is a reduced n-type concentration in the p-n junction 610. Additionally, the p-n junction 610 extends deeper and farther away from the p-type doped region 602 than in prior art diodes, thereby increasing the ideality of the diode.

One advantage of the diode manufacturing process disclosed herein is that the ideality of the resultant diode is improved over a diode formed using prior art methods. The Shockley ideal diode equation or the diode law gives the I-V characteristic of an ideal diode in either forward or reverse bias. The current-voltage relation is:

$$I = I_S(e^{V_D/(nV_T)} - 1) \qquad \text{Eq. (1)}$$

where I is the diode current, $I_S$ is the reverse bias saturation current (or scale current), $V_D$ is the voltage across the diode, $V_T$ is the thermal voltage, and n is ideality factor, also known as the quality factor or sometimes the emission coefficient. The ideality factor n may vary between 1 and 2, depending on the fabrication process and the semiconductor material.

Figure 7:
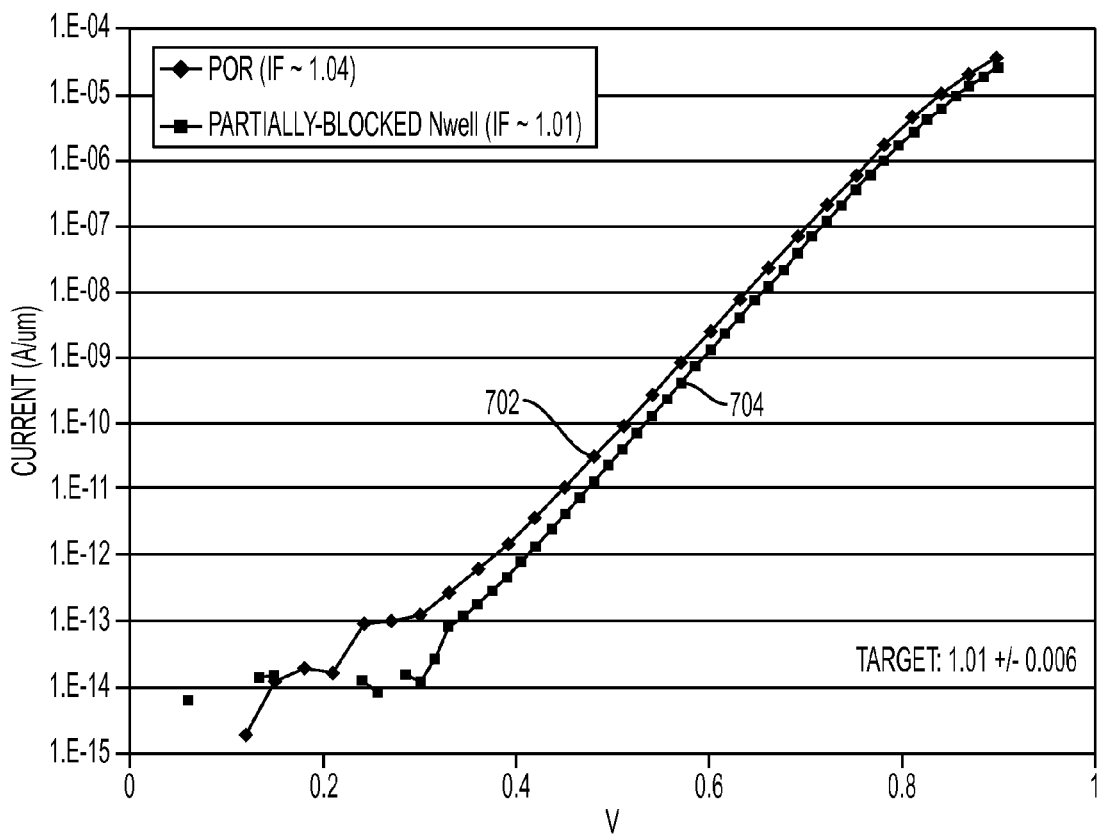
FIG. 7 shows a graph comparing current-voltages relations for various diodes.

FIG. 7 shows a graph 700 comparing current-voltage relations for various diodes. Current is plotted logarithmically along the y-axis in amperes/micrometer and voltage is plotted along the x-axis in volts. The slope of the curves is therefore related to the ideality factor. As shown in FIG. 7, the ideality factor of curve 702 for a diode formed using prior art methods is about 1.04. The ideality factor of curve 704 for the diode formed using the partially-blocked N-well disclosed herein is about 1.01. Thus, a diode formed using the method disclosed herein has an improved ideality factor versus prior art methods.

Figure 8:
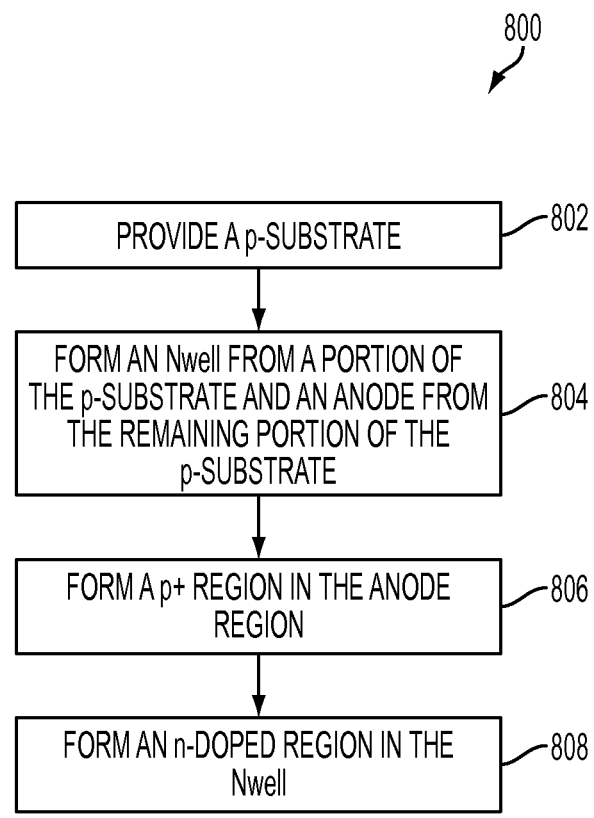
FIG. 8 shows a flowchart illustrating an exemplary method of forming a diode as disclosed herein.

FIG. 8 shows a flowchart 800 illustrating an exemplary method of forming a diode as disclosed herein. In box 802, a substrate material is provided. In various embodiments, the substrate is a p-type substrate. In box 804, an N-well is formed at a portion of the p-type substrate. A portion of the substrate that is not formed into the N-well is thereby an anode. In general, the N-well and anode are formed by partially blocking the substrate during the ion implantation stage. In an exemplary embodiment, an interface between the anode and the N-well extends through the substrate from one surface (generally the surface receiving implantation ions) to a surface opposite the implantation surface. In box 806, a p-type doped region is formed in the anode. In one embodiment, the p-type doped region is formed at the substantial interface between the anode and the N-well. In box 808, an n-type doped region is formed in the N-well.

Figure 9:
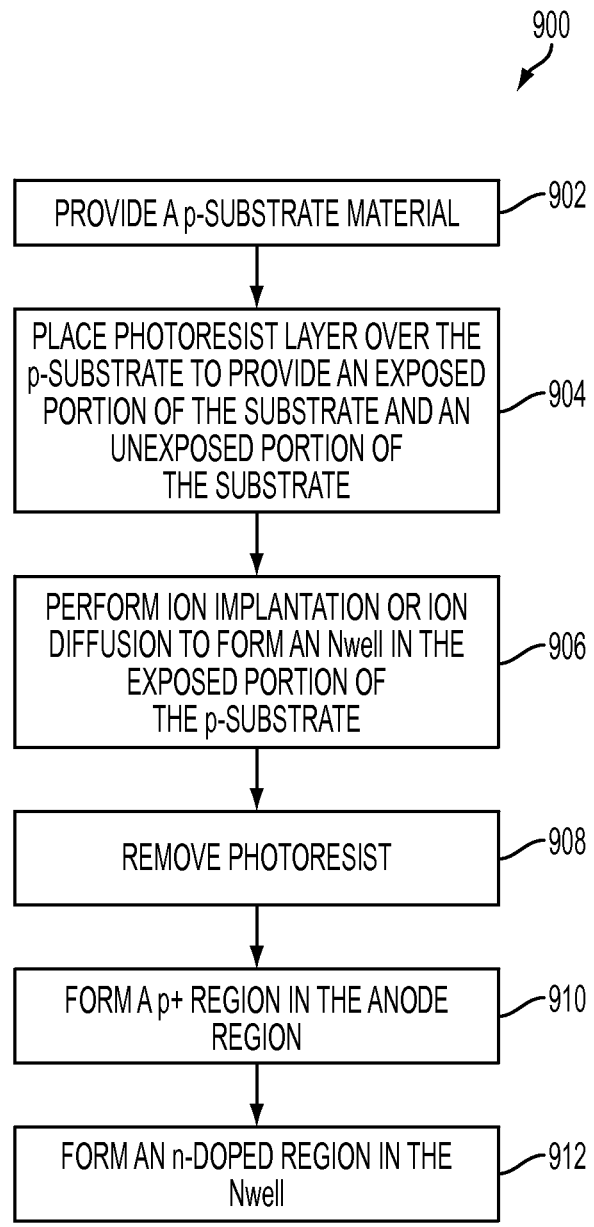
FIG. 9 shows a flowchart illustrating a detailed method for forming the exemplary semiconductor diode.

FIG. 9 shows a flowchart 900 illustrating a detailed method for forming a diode disclosed herein. In box 902, a substrate such as a p-type substrate is provided. In box 904, a photoresist layer is placed over the substrate to partially block ions during subsequently ion implantation. The photoresist layer provides an exposed portion of the p-type substrate and a covered (unexposed) portion. In box 906, ion implantation or ion diffusion or suitable ion implantation method is performed to form an N-well in the exposed portion of the substrate. In box 908, the photoresist layer is removed, thereby revealing a substrate partitioned into a p-type anode and an N-well. In box 910, a p-type doped region is formed in the anode region. In box 912, an n-type doped region is formed in the N-well.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of manufacturing a semiconductor device, comprising:
   doping a p-type substrate to form an N-well from one portion of the p-type substrate adjacent an anode region from another portion of the p-type substrate, wherein an interface between the N-well and the anode extends vertically from a top surface of the p-type substrate to a bottom surface of the p-type substrate;
   etching a cavity to a selected depth in the anode region adjacent the N-well;
   depositing p-type doped material in the cavity to form a p-type doped region adjacent the N-well, wherein the interface between the N-well and the anode provides a sidewall boundary of the p-type material and a p-n junction associated with the p-type doped region extends into the N-well and into the anode region; and
   forming a gate stack on the N-well having a spacer, wherein an outer sidewall of the gate stack is aligned with the vertical interface between the N-well and the anode.

2. The method of claim 1, wherein doping the p-type substrate further comprises performing one of ion diffusion and ion implantation on a selected portion of the p-type substrate.

3. The method of claim 1, further comprising selectively covering the anode region with a photoresist layer prior to doping the p-type substrate.

4. The method of claim 1, wherein the N-well extends from an ion implantation surface of the substrate to a surface opposite the ion implantation surface of the substrate.

5. The method of claim 1, wherein the semiconductor device further includes a semiconductor diode.

6. The method of claim 1, further comprising forming the semiconductor device on an integrated chip.

7. The method of claim 1, further comprising forming an electronic component at a surface of the substrate.

8. The method of claim 1, further comprising forming an n-type doped region in the N-well.

9. The method of claim 8, wherein the p-type doped region includes silicon germanium and the n-type doped region include silicon carbon.

10. A method of manufacturing a diode, comprising:
    forming a photoresist layer over a p-type substrate to selectively cover a portion of the p-type substrate and leave exposed another portion of the p-type substrate;
    forming an N-well at the exposed portion of the p-type substrate, wherein the covered portion forms an anode region such that an interface between the N-well and the anode extends vertically from a top surface of the P-type substrate to a bottom surface of the p-type substrate;
    etching a cavity to a selected depth in the anode region adjacent the N-well;
    depositing p-type doped material in the cavity to form a p-type doped region adjacent the N-well, wherein the interface between the N-well and the anode provides a sidewall boundary of the p-type material and a p-n junction associated with the p-type doped region extends into the N-well and into the anode region; and forming a gate stack on the N-well having a spacer, wherein an outer sidewall of the gate stack is aligned with the vertical interface between the N-well and the anode.

11. The method of claim 10, further comprising forming the N-well via one of ion diffusion and ion implantation at the exposed portion of the p-type substrate.

12. The method of claim 10, wherein the N-well extends from an ion implantation surface of the substrate to a surface opposite the ion implantation surface of the substrate.

13. The method of claim 10, further comprising forming an electronic component at a surface of the substrate.

14. The method of claim 10, further comprising forming the diode from a substrate on an integrated chip.

15. A method of manufacturing a diode, comprising:
    forming an anode and an N-well on a p-type substrate by partially blocking the substrate during ion doping, wherein an interface between the N-well and the anode extends vertically from a top surface of the P-type substrate to a bottom surface of the p-type substrate;
    etching a cavity to a selected depth in the anode region adjacent the N-well;
    depositing p-type doped material in the cavity to form an extrinsically p-type doped region adjacent the N-well, wherein the interface between the N-well and the anode provides a sidewall boundary of the p-type material and a p-n junction associated with the p-type doped region extends into the N-well and into the anode region; and
    forming a gate stack on the N-well having a spacer, wherein an outer sidewall of the gate stack is aligned with the vertical interface between the N-well and the anode.

16. The method of claim 15, further comprising forming the N-well via one of ion implantation and ion diffusion.

17. The method of claim 15, further comprising forming an electronic component at a surface of the substrate.

* * * * *